United States Patent [19]

Tottori et al.

[11] 4,320,254
[45] Mar. 16, 1982

[54] VOLUME CONTROL APPARATUS

[75] Inventors: Kenzo Tottori; Yukio Akaba; Shunichi Suganuma, all of Tokyo, Japan

[73] Assignee: Sony Corporation, Tokyo, Japan

[21] Appl. No.: 137,845

[22] Filed: Apr. 7, 1980

[30] Foreign Application Priority Data

Apr. 5, 1979 [JP] Japan .................................. 54-41327
Apr. 12, 1979 [JP] Japan ............................. 54-48817[U]

[51] Int. Cl.³ ............................................. H03G 3/00
[52] U.S. Cl. ................................................. 179/1 VL
[58] Field of Search ............... 179/1 VL, 1 D, 1 VC, 179/1 P; 455/232, 234, 245, 246, 219

[56] References Cited

U.S. PATENT DOCUMENTS 3,444,323  5/1969  Nagashima et al. ............. 179/1 VL

*Primary Examiner*—Raymond F. Cardillo, Jr.
*Assistant Examiner*—J. A. Popek
*Attorney, Agent, or Firm*—Hill, Van Santen, Steadman, Chiara & Simpson

[57] ABSTRACT

A volume control apparatus wherein a master volume control resistor is controlled by a motor and a control circuit is provided for the motor which includes a presettable-variable resistor and a slave-variable resistor which is driven by the output shaft of the motor. A first comparator is connected to the presettable-variable resistor and to the slave-variable resistor which are in turn connected across suitable supply voltages and depending upon the relative voltages across these resistors a motor control discriminator circuit operates the motor in either the clockwise or counterclockwise direction to vary the master volume control and the slave-variable resistor until the slave-variable resistor is substantially equal to the presettable-variable resistor. When the resistance of the slave-variable resistor approaches the presettable-variable resistor the output of the master volume control is connected to an output speaker by a relay circuit.

9 Claims, 4 Drawing Figures

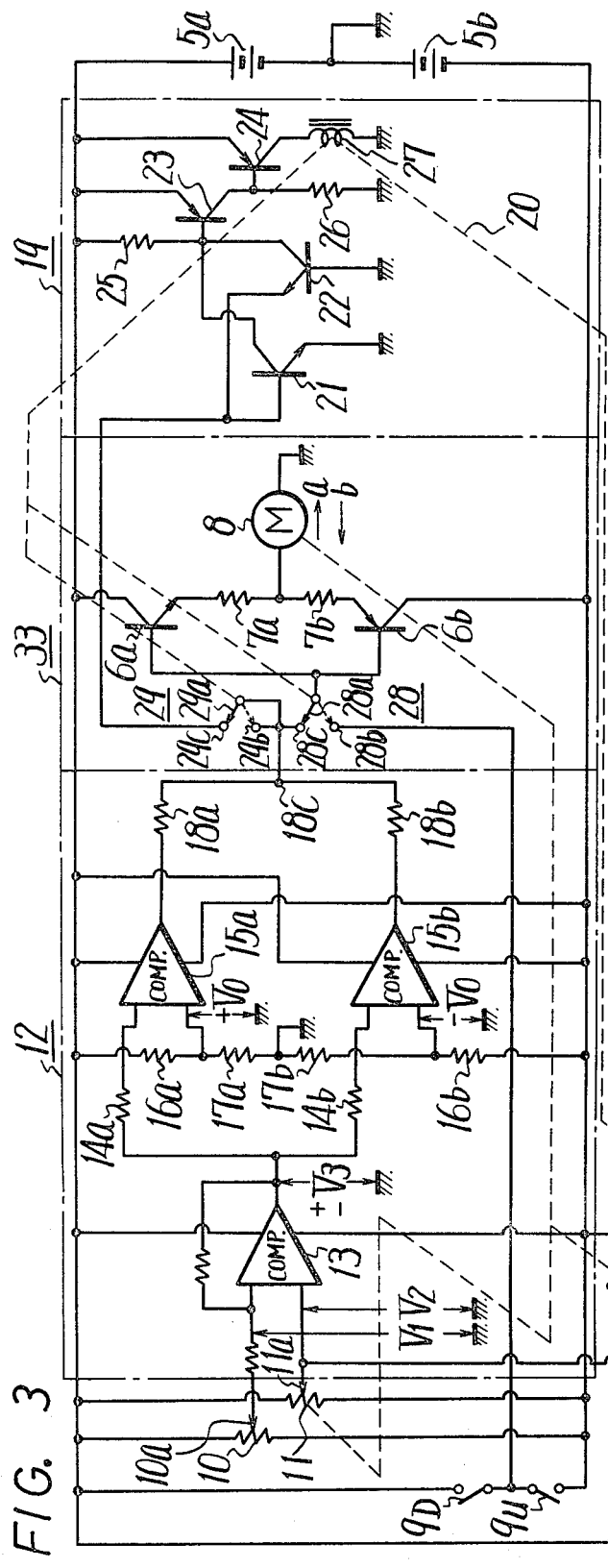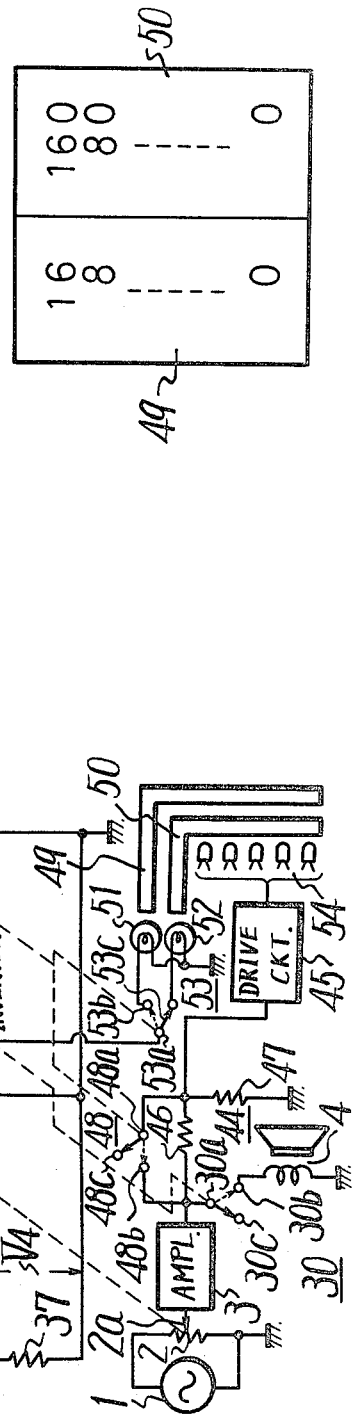

VOLUME CONTROL APPARATUS

BACKGROUND OF THE INVENTION

1. Field of the Invention

The present invention relates generally to a volume control apparatus, and is directed more particularly to a volume control apparatus for use with remote control.

2. Description of the Prior Art

In the art, when the output from an electronic instrument is displayed digitally by a power meter which is formed of a plurality of display elements such as LEDs, such an attempt has been carried out to reduce the number of display elements which will display the output over a wide range from a low output level to a high output level. However, in the display device for a relatively large amplifier apparatus of the prior art, when the sound volume is low, the number of display elements is small and the display of outputs is unclear. While, when the sound volume is large, the level difference between the display elements is large and hence the display accuracy is deteriorated. That is, the prior art output display device can not perform the display function frequency with accuracy. In order to avoid the above defect, if the number of display elements is increased, the display apparatus becomes expensive.

Recently, in an electronic instrument, switching means for adjusting the sound volume and a power source switch are provided separately, and the volume adjustment and ON/OFF of the power source switch are carried out by the manual operation and remote control. In this case, when the power source switch is made OFF, the volume for the sound volume adjustment is made to remain at the set value open the power switch being made OFF. Therefore, when the power switch is made ON again, the sound corresponding to the previous set value is abruptly outputted from a speaker, which is inconvenient. Especially, in the remote controller, there are only provided operating buttons for ON-OFF of the power switch and increase, decrease of sound volume, and there is provided no scale for showing the set value of sound volume, so that it is not apparent which value of sound is produced when the power switch is made ON by the remote control.

Further, when the power switch of the electronic instrument is cut OFF, the power source for a motor, which will adjust the sound volume in accordance with the command from the remote controller, is also cut OFF. Therefore, the set value of the sound volume upon the power switch being made OFF becomes the set value of sound volume upon the power switch being made ON again, so that there may occur a high impact sound outputted from the speaker upon the power switch being made ON thereafter.

OBJECTS AND SUMMARY OF THE INVENTION

Accordingly, an object of the present invention is to provide a volume control apparatus free from the defects encountered in the prior art.

Another object of the invention is to provide a volume control apparatus which is presettable.

A further object of the invention is to provide a novel volume control apparatus which is suitable to be remotely controlled.

In accordance with an aspect of the present invention, a volume control apparatus is provided which includes a master-variable resistor for a volume control, a slave-variable resistor having first, second and third terminals, the resistance between the second and third terminals of which is varied in response to changes of the resistance of the master-variable resistor, a presettable-variable resistor having first, second and third terminals, a DC voltage source, a coupling circuit for supplying the DC voltage of the DC voltage source between the first and second terminals of the slave- and presettable-variable resistors, respectively, a first comparator for comparing the voltages across the second and third terminals of the slave-and presettable-variable resistors and producing an output signal proportional to the voltage difference therebetween, a second comparator for comparing the output signal voltage of the first comparator with a reference DC voltage and producing a control signal when the output signal voltage from the first comparator is greater than the reference DC voltage, and a control circuit supplied with the control signal from the second comparator and controlling the resistance of the master-variable resistor so as to reduce the voltage difference across the second and third terminals of the presettable- and slave-variation resistors.

The other objects, features and advantages of the present invention will become apparent from the following description taken in conjunction with the accompanying drawings through which the like references designate the same elements and parts.

BRIEF DESCRIPTION OF THE DRAWINGS

FIG. 3 is a circuit diagram showing another embodiment of the invention; and

FIG. 4 is a front view of a scale plate used in the embodiment of the invention shown in FIG. 3.

DESCRIPTION OF THE PREFERRED EMBODIMENTS

Figure 1:
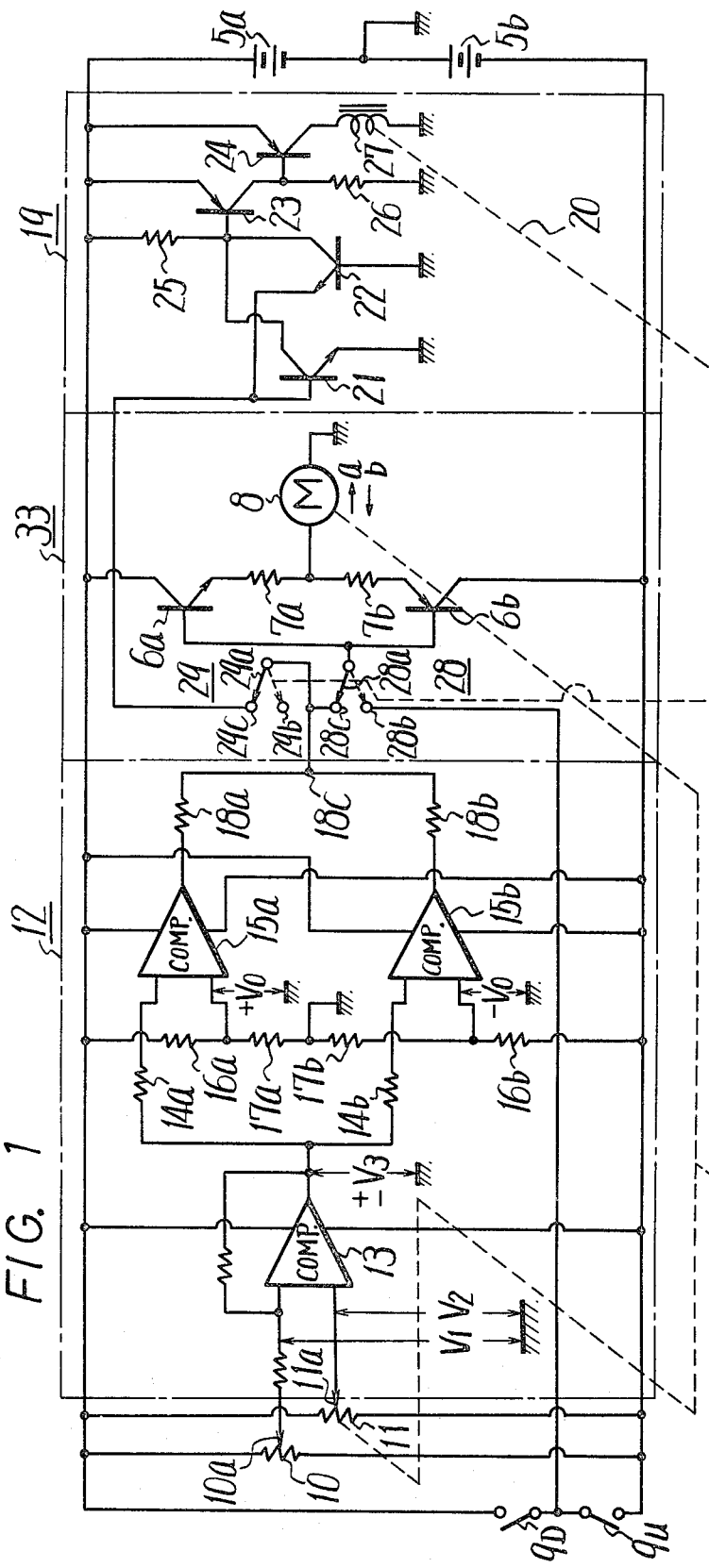
FIG. 1 is a circuit diagram showing a preferred example of the volume control apparatus according to the present invention.

An example of the volume control apparatus according to one embodiment of the present invention is shown in FIG. 1. In the figure, 1 designates a signal source of a low frequency, 2 a master volume control or master variable resistor for adjusting the sound volume, and 3 an amplifier for a low frequency signal whose output is directly supplied to a speaker 4. A one-dot chain line block 33 in FIG. 1 is a control circuit to control the master variable resistor 2.

Now, the control circuit 33 will be described. DC voltage sources 5a and 5b are connected in series and the connection point therebetween is grounded. The positive and negative output voltages from the serially connected DC voltage sources 5a and 5b are applied across the series circuit consisting of the collector-emitter path of an NPN transistor 6a, resistors 7a, 7b and the emitter-collector path of PNP transistor 6b in the control circuit 33. The connection point between the resistors 7a and 7b is grounded through a motor 8 which drives a movable or slidable contact 2a of the master variable resistor 2. Between the output terminals of the serially connected voltage sources 5a and 5b, connected is a series connection of a normally opened DOWN and UP switches 9D and 9U. The connection point between the switches 9D and 9U is generally connected to the connection points of the bases of transistors 6a and 6b through a switch 28 (which will be described later) as shown by the broken line in FIG. 1. The switches 9D and 9U can be operated manually or automatically with a remote control signal. When the DOWN switch 9D is made ON, a positive voltage is supplied from the voltage source 5a, to the bases of transistors 6a, 6b through the closed switch 9D and switch 28. Thus, the NPN transistor 6a turns ON and hence a current flows from the voltage source 5a to the ground through the collector-emitter path of transistor 6a, resistor 7a and motor 8 in the direction by an arrow a. As a result, the motor 8 is rotated, the movable contact 2a of master variable resistor 2 is rotated in, for example, the counter clockwise direction, and the sound volume is controlled to be decreased. While, when the UP switch 9U is made ON, the PNP transistor 6b becomes ON and a current flows through the emitter-collector path of transistor 6b and the motor 8 from the voltage source 5b in the direction of an arrow b. As a result, the movable contact 2a is rotated in the clockwise direction to increase the sound volume.

Further, in the example shown in FIG. 1, there are provided a presettable variable resistor 10 and a slave variable resistor 11 which is meshed with the master variable resistor 2 to detect the operated position of master variable resistor 2. Also, provided is a discriminator circuit 12 which will compare the position of a slidable or movable contact 11a of slave variable resistor 11 with the position of a slidable or movable piece 10a of presettable variable resistor 10.

In the discriminator circuit 12, there is provided a comparator 13. This comparator 13 will detect a voltage difference V3 between a reference voltage V1 appearing at the movable contact 10a of presettable variable resistor 10, which is connected to the serially connected voltage sources 5a and 5b, and a detected voltage V2 appearing at the movable contact 11a of slave variable resistor 11, which is connected to the serially voltage sources 5a and 5b (in the illustrated example, both voltages V1 and V2 include negative voltages), detect the polarity of the difference voltage V3 (where it is assumed that when V2 is higher than V1 in potential, the polarity is taken as +, while V2 is lower than V1, the polarity as −), and also detect whether or not the voltage difference ±V3 is within the range from preliminarily set voltages +V0 and −V0. When the discriminator circuit 12 delivers an output upon the power switch of an electronic instrument being made ON, namely the voltage difference ±V3 is outside the range between +V0 and −V0, the control circuit is driven by the output from the discriminator circuit 12 in such a manner that the slave variable resistor 11 and master variable resistor 2 are operated to make the voltage difference ±V3 fall within the set range. In this case, as the presettable variable resistor 10, a plurality of fixed resistors connected in series may be used and the reference voltage V1 is obtained at one of the connection points between adjacent fixed resistors.

In order to obtain the voltages V1 and V2, in the illustrated example of this invention, the presettable and slave variable resistors 10 and 11 are respectively connected to the serially connected voltage sources 5a and 5b. In the discriminator circuit 12, the output terminal of the comparator 13 which is supplied with the voltages V1 and V2 is connected through resistors 14a and 14b to one of the input terminals of each of comparators 15a and 15b which form a pair. A series connection consisting of resistors 16a, 17a, 17b and 16b is connected between the output terminals of serially connected voltage sources 5a and 5b. The connection point between resistors 17a and 17b is grounded, and the connection points between resistors 16a, 17a and between resistors 17b, 16b are respectively connected to the other input terminal of each of comparators 15a and 15b. The output terminals of both comparators 15a and 15b are connected together through resistors 18a and 18b as an output terminal 18c. This output terminal 18c is connected to the bases of transistors 6a and 6b through the switch 28 which will be described later in detail. The voltages +V0 and −V0, which are the above set voltages and applied to the other input terminals of the respective comparators 15a and 15b, are determined by the resistance values of resistors 17a and 17b.

In the example of FIG. 1, a switching control circuit 19 is provided. In this switching control circuit 19, there are provided NPN transistors 21 and 22. The base of the former is connected to the emitter of the latter. The collectors of both transistors 21 and 22 are connected together to the positive terminal of voltage source 5a through a resistor 25. PNP transistors 23 and 24 are also provided whose emitters are connected to the positive terminal of voltage source 5a, the base of transistor 23 is connected to the connection point between the collectors of transistors 21 and 22, and the collector of transistor 23 is connected to the base of transistor 24 and grounded through a resistor 26. The collector of transistor 24 is grounded through a winding 27 of a relay serving as a switch device 20. The emitter of transistor 21 and the base of transistor 22 are respectively grounded.

The switch device, i.e., relay 20 includes three relay switches 28, 29 and 30 operated by the relay winding 27. The relay switch 28 consists of a movable contact 28a connected to the bases of transistors 6a, 6b and two fixed contacts 28b, 28c. The fixed contact 28b is connected to the connection point between switches 9D and 9U, and the fixed contact 28c is connected to the output terminal 18c of the discriminator circuit 12. The relay switch 29 consists of a movable contact 29a connected to the output terminal 18c of discriminator circuit 12, a fixed contact 29c connected to the base of transistor 21 and to the emitter of transistor 22, and a floating or open fixed contact 29b. The relay switch 30 consists of a movable contact 30a connected to the output terminal of amplifier 3, a fixed contact 30b connected to one of the input terminals of speaker 4, and a floating or open fixed contact 30c. When the relay 20 is not energized (or the transistor 24 is in an OFF-state), it is assumed that the movable contacts or contacts 28a, 29a and 30a of relay switches 28, 29 and 30 are respectively switched to the positions shown by the solid lines in FIG. 1.

Now, the operation of the volume control apparatus according to the invention with the construction shown in FIG. 1 will be described. Before the power voltage is not applied to the apparatus (the power is not applied to the amplifier 3, discriminator circuit 12 and switching control circuit 19), the respective relay switches 28, 29 and 30 are switched to the positions shown by the solid lines in FIG. 1. Under such state, when the power voltage is applied to the respective circuit elements, the voltages V1 and V2 are produced from the presettable and slave variable resistors 10 and 11, respectively, and then compared in the comparator 13. If the voltage V2 is higher than the voltage V1 (V2>V1), the comparator 13 delivers the difference voltage +V3. When the voltage +V3 is higher than the set value V0 (V3>V0), the positive voltage +V3 delivered from the output terminal of comparator 15*l* is applied through the contacts 28c and 28a of relay switch 28 to the bases of transistors 6a and 6b. Thus, in this case, the transistor 6a is made ON, so that the current is supplied from the voltage source 5a through the transistor 6a to the motor 8 in the direction a to drive the motor 8. Therefore, the master variable resistor 2 and the slave variable resistor 11 are driven in the counter clockwise direction or controlled so that the voltage V2 comes close to the voltage V1. In this case, such a voltage (current) to which the transistor 6a is switched is delivered from the comparator 15a.

Under this state, since the voltage appeared at the output terminal 18c or connection point between resistors 18a and 18b is applied through the contacts 29a, 29c of switch 29 to the base of transistor 21 and to the emitter of transistor 22 in the switching control circuit 19, the transistor 21 turns ON and hence the transistor 23 turns ON. As a result, the transistor 24 turns OFF or the relay 20 is deenergized to hold the respective relay switches 28, 29 and 30 in the states shown by the solid lines and accordingly the above operation is continued.

When the voltage V2 is caused to approach the reference voltage V1, and hence the voltage +V3 falls within the range between +V0 and −V0, comparator 15a produces no output. Thus, the transistors 21 and 23 turn OFF, respectively and the transistor 24 turns ON. As a result, the relay 20 is energized to switch the respective relay switches 28, 29 and 30 to the states shown by the broken lines, so that the output from the amplifier 3 is fed through the switch 30 to the speaker 4. Thereafter, the motor 8 can be rotated in a desired direction by selectively operating the switches 9D and 9U, namely the sound volume can be adjusted desirably. Upon this adjustment of the sound volume, even if the voltage V2 deviates much from the reference voltage V1 again, since the relay switch 29 is changed over in the position shown by the broken line, the switching control circuit 19 is not operated by the output from the discriminator circuit 12.

The above operation relates to a case where the voltage V2 is higher than the reference voltage V1. However, when the voltage V2 is lower than the reference voltage V1 (V1>V2), the other transistor 6b is made ON by the output from the comparator 15b and the current is supplied from the voltage source 5b to the motor 8 in the direction b. Thus, the master and slave variable resistors 2 and 11 are driven in a clockwise direction to make the voltage V2 come close to the reference voltage V1. In this case, in the switching control circuit 19, the transistors 22 and 23 turn ON and the transistor 24 turns OFF.

When the voltage −V3 falls within the set range between −V0 and +V0, as described above, the relay 20 is energized and its relay switches 28, 29 and 30 are changed over to the positions shown by the broken lines, respectively. Thereafter, the sound volume can be adjusted by the switches 9D and 9U similar to the above case.

When the voltage V2 is already close to the reference voltage V1 or the difference voltage ±V3 is within the set range between +V0 and −V0 upon the power switch being made ON, neither transistors 21 and 22 in the switching control circuit 19 turn ON, so that the transistor 23 does not turn ON. Accordingly, the transistor 24 turns ON immediately to energize the relay 20, so that its relay switches 28, 29 and 30 are respectively changed over to the positions shown by the broken lines. Thus, the motor 8 and accordingly the master variable resistor 2 can be operated by the switches 9D and 9U immediately.

As described above, the master variable resistor 2 can be operated by the switches 9D and 9U. However, when the power switch of the electronic instrument is cut OFF, the relay 20 is deenergized and accordingly its respective relay switches 28, 29 and 30 automatically turn to the positions shown by the solid lines for standby to the next power supply.

Figure 2:
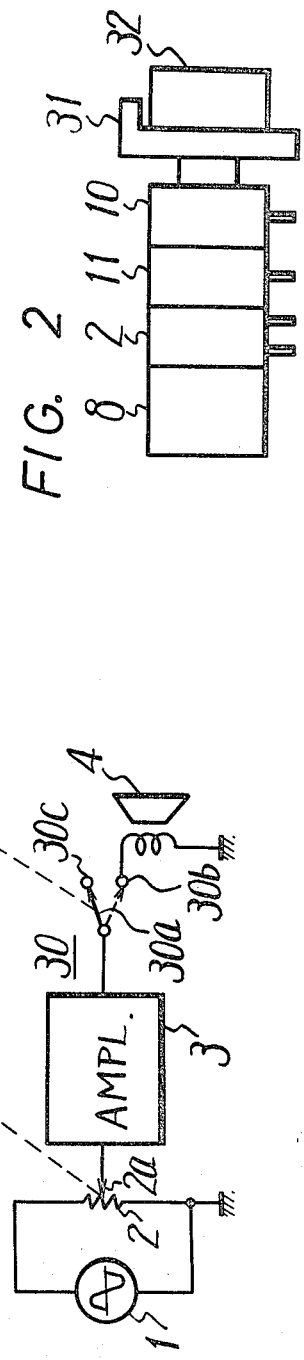
FIG. 2 is a side view showing variable resistors and a motor used in the example of the invention shown in FIG. 1.

The master variable resistor 2, the slave variable resistor 11 which detects the operating position of resistor 2 and the presettable variable resistor 10 are located on a single shaft as shown in FIG. 2 as a resistor device. In this case, the preset value of presettable variable resistor 10 is set by an operating knob 31, and the master and slave variable resistors 2 and 11 are adjusted by a manual operating knob 32 and also by the motor 8 through a transmission mechanism or gear (not shown).

According to the example of the invention shown in FIG. 1 and 2, upon supplying power to the electronic instrument, the master variable resistor 2 is automatically set to the value which is preliminarily set by the presettable variable resistor 10, and thereafter the switching control circuit 19 operates to make the speaker 4 sound. Therefore, it can be avoided by suitably setting the presettable-variable resistor 10 that a large sound is emitted abruptly from the speaker 4 when the power is supplied to the electronic instrument.

Another example of the invention will be now described with reference to FIG. 3 in which the elements same as those used in FIG. 1 are marked with the same reference and their description will be omitted.

In the example of the invention shown in FIG. 3, in addition to the construction shown in FIG. 1, another comparator 35 is provided so as to change over the range of a display meter in response to the output level. This comparator 35 compares the voltage V2, which is detected by the slave variable resistor 11 meshed with the master variable resistor 2, with a reference voltage V4. That is, one of the input terminals of comparator 35 is connected to the movable contact 11a of slave variable resistor 11 and the other input terminal is connected to the connection point between reference voltage setting resistors 36 and 37 which are connected in series between the positive terminal of power source 5a and the ground. The output terminal of comparator 35 is connected through an inverter 38 and a resistor 39 to the base of a transistor 40 whose collector is connected through a relay 41 to the positive terminal of voltage source 5a and whose emitter is grounded. While, the output terminal of amplifier 3 is connected through an attenuator 44 to a drive circuit 45 which will drive power display elements of the display meter. The output terminal of drive circuit 45 is connected to terminals of a plurality of light emission diodes (LEDs) 54 serving as power display elements. In this case, the attenuator 44 is formed of resistors 46 and 47 which are connected in series between the output terminal of amplifier 3 and the ground for presenting, for example, 1/10 attenuation amount. A switch 48 is connected in parallel to the resistor 46 which switch 48 is changed over by the relay 41 to release the attenuation.

In FIG. 3, 49 and 50 respectively designate scale plates of the display meter consisting of display elements 54 and drive circuit 45. As shown in FIG. 4, the scale plate 49 serves to display a lower range of the power and the scale plate 50 serves to display a higher range of the power or ten times as much as the lower range. The scale plates 49 and 50 are used to be changed over by illumination lamps 51 and 52 shown in FIG. 3. In FIG. 3, 53 designates a relay switch 53 which is changed over by the relay 41. When the relay 41 is not energized, the relay switch 53 is changed over to the position shown by the solid line, so that at this time the voltage from the voltage source 5b is supplied to the lamp 52 through a movable contact 53a and a fixed contact 53c of switch 53.

While, when the relay 41 is energized, the relay switch 53 is changed over to the position shown by the broken line, so that the voltage from the voltage source 46 is supplied to the lamp 51 through the movable contact 53a and a fixed contact 53b of relay switch 53. Accordingly, when the sound volume is in the small range, the lamp 51 is lit to illuminate the scale plate 49, while when the sound volume is in the large range, the lamp 52 is lit to illuminate the scale plate 50. Thus, the sound output can be positively and accurately read on the different scale plates 49 and 50 in accordance with the level thereof.

Now, a description will be given on the operation of the example of the invention shown in FIG. 3. Until the rotating angle of master variable resistor 2 is smaller than a certain constant angle $\theta$ (for example, angle corresponding to the time 10:30 in a clock), the voltage V2 delivered from the slave variable resistor 11 for detecting the operating position of master variable resistor 2 is lower than the reference voltage V4 given by the resistors 36 and 37. Thus, the output voltage from the comparator 35 is low, so that the output voltage from the inverter 38 is high. As a result, the transistor 40 is made ON and then the relay 41 is energized to change over its relay switches 48 and 53 to the positions shown by the broken lines. Thereby, the output from the amplifier 3 is supplied to the drive circuit 45 without being attenuated and the display elements 54 are driven by the drive circuit 54. At the same time, the lamp 51 is lit and the power can be read on the scale plate 49 with high accuracy.

When the rotating angle of master variable resistor 2 is selected greater than $\theta$, the voltage V2 from the slave variable resistor 11 increases more than the reference voltage V4. Thus, the output voltage from the comparator 35 becomes high and hence the output voltage from the inverter 38 becomes low. Therefore, the transistor 40 turns OFF to release the energization of relay 41 with the result that the relay switches 48 and 53 are changed over to the positions shown by the solid lines, respectively. Accordingly, the output from the amplifier 3 is attenuated by the attenuator 44 by 1/10 and then fed to the drive circuit 45 to drive the display elements 54. At this time, the lamp 52 is lit so that the power can be read on the scale plate 50 with high accuracy.

According to the example of the invention shown in FIGS. 3 and 4, upon supplying power to the electronic instrument, the master variable resistor 2 is automatically set to the value which is preliminarily set by the presettable variable resistor 10, and thereafter the switching control circuit 19 operates to make the speaker 4 sound. Therefore, it can be avoided by suitably setting the presettable variable resistor 10 that a sound is emitted abruptly from the speaker 4 when the power is supplied to the electronic instrument similar to the first example of the invention.

Further, in the second example of the invention, the range of the display meter is changed over in accordance with low and high outputs corresponding to the operating position of master variable resistor 2, so that the output can be displayed without increasing the number of the display elements and regardless of the magnitudes of outputs.

Further, it may be possible that, in the examples of the invention, the loudness control circuit (not shown in the figures) is made ON and OFF by the relay upon low sound and also that a moving coil, moving iron piece meter or the like is employed as the power meter whose scale plate is changed over to high and low ranges.

It will be apparent that many modifications and variations could be effected by one skilled in the art without departing from the spirit or scope of the novel concepts of the present invention, so that the spirit or scope of the invention should be determined by the appended claims only.

We claim as our invention:

1. A volume control apparatus comprising:
   (a) a master-variable resistor for a volume control;
   (b) a slave-variable resistor having first, second and third terminals, the resistance between the second and third terminals of which is varied in response to changes of the resistance of said master-variable resistor;
   (c) a presettable-variable resistor having first, second and third terminals;
   (d) a DC voltage source;
   (e) coupling circuit means for supplying the DC voltage of said DC voltage source to the first and second terminals of said presettable-variable resistor, and said slave-variable resistor, respectively;
   (f) first comparator means for comparing the voltages across the second and third terminals of said slave- and presettable-variable resistors and producing an output signal proportional to the voltage difference therebetween;
   (g) second comparator means for comparing the output signal voltage from said first comparator means with a reference DC voltage and producing a control signal when the output signal voltage from said first comparator means is greater than said reference DC voltage; and
   (h) control circuit means supplied with the control signal from said second comparator means and for controlling the resistance of said master-variable resistor and said slave-variable resistor.

2. A volume control apparatus according to claim 1, in which said control circuit means comprises:
   (a) a motor drive circuit supplied with said control signal; and
   (b) a motor connected to the output of said motor drive circuit to control the respective resistances of said master-variable resistor and said slave-variable resistor in response to said control signal.

3. A volume control apparatus according to claim 2, in which said second comparator means comprises:
   (a) a positive DC voltage comparator having a pair of input terminals and an output terminal, one of said input terminals being supplied with the output signal of said first comparator means and the other input terminal being supplied with a positive reference DC voltage, (b) a negative DC voltage comparator having a pair of input terminals and an output terminal, one of said input terminals being supplied with the output signal of said first comparator means and the other input terminal being supplied with a negative reference DC voltage;

(c) a second coupling circuit means for coupling the output terminals of said positive and negative DC voltage comparators to said motor drive circuit.

4. A volume control apparatus according to claim 3, in which said motor drive circuit comprises a pair of complementary transistors connected in push-pull relation across said DC voltage source, the input electrodes thereof being connected to each other and to the output terminals of said positive and negative DC comparators and the output electrodes thereof being connected to each other and to said motor.

5. A volume control apparatus according to claim 1, further including:

(a) signal input means for supplying an input signal across said master-variable resistor;

(b) an amplifier connected to the output of said master-variable resistor and for supplying an amplified signal to a load; and (c) changing-over means connected to the output of said second comparator means to ON/OFF control said amplified signal transmission to said load in response to said control signal from said second comparator means.

6. A volume control apparatus according to claim 5, in which said changing-over means comprises:

(a) switching transistor means connected to the output of said second comparator means and for producing an output signal when said control signal from said second comparator means is not present;

(b) relay means having a relay coil controlled by the output signal of said switching transistor means, a first relay switch connected between said amplifier and load and a second relay switch connected between said second comparator means and said motor drive circuit.

7. A volume control apparatus according to claim 6, further including a pair of UP/DOWN control switches connected to said DC voltage source and said motor drive circuit through said second relay switch.

8. A volume control apparatus according to claim 5, further including a display drive circuit connected to said amplifier, display means connected to said drive circuit to indicate the Volume Unit of said amplifier output, and display range changing-over means.

9. A volume control apparatus according to claim 8, in which said display range changing-over means comprises third comparator means for comparing the voltage across said second and third terminals of said slave-variable resistor and a reference DC voltage and for producing a control signal when said output signal level of said amplifier exceeds a predetermined value and a further relay means connected to said third comparator means to change-over the range of said display means.

* * * * *